United States Patent
Furukawa et al.

[11] Patent Number: 6,096,598
[45] Date of Patent: Aug. 1, 2000

[54] METHOD FOR FORMING PILLAR MEMORY CELLS AND DEVICE FORMED THEREBY

[75] Inventors: Toshiharu Furukawa, Essex Junction; Mark C. Hakey; Steven J. Holmes, both of Milton; David V. Horak, Essex Junction; Paul A. Rabidoux, Winooski, all of Vt.

[73] Assignee: International Business Machines Corporation, Armonk, N.Y.

[21] Appl. No.: 09/182,388

[22] Filed: Oct. 29, 1998

[51] Int. Cl.⁷ .................................. H01L 21/8242
[52] U.S. Cl. .......................... 438/249; 438/270; 438/392; 438/561
[58] Field of Search ..................... 438/249, 270, 438/392, 558, 531, 525, 561; 148/DIG. 143, FOR 212, FOR 240

[56] References Cited

U.S. PATENT DOCUMENTS

| | | |
|---|---|---|
| 4,280,854 | 7/1981 | Shibata et al. . |
| 4,761,464 | 8/1988 | Zeigler . |
| 4,767,695 | 8/1988 | Ong et al. . |
| 5,039,593 | 8/1991 | Zeigler . |
| 5,185,294 | 2/1993 | Lam et al. . |
| 5,252,766 | 10/1993 | Sakakura et al. . |
| 5,306,390 | 4/1994 | Peek . |
| 5,436,463 | 7/1995 | Rostoker . |
| 5,618,751 | 4/1997 | Golden et al. . |
| 5,849,435 | 12/1998 | Akram et al. . |
| 5,866,306 | 2/1999 | Miller et al. . |
| 6,040,210 | 3/2000 | Burns, Jr. et al. . |

FOREIGN PATENT DOCUMENTS 201 0535  6/1988  Japan .

OTHER PUBLICATIONS

Timothy W. Weidman and Ajey M. Joshi, "New Photodefinable Glass Etch Masks For Entirely Dry Photolighogroahy: Plasma Deposited Organosilicon Hydride Polymers", Appl. Phys, Lett. 62(4), Jan. 25, 1993, p372–374.

R.L. Kostelak, T.W. Weidman, and S. Vaidya, "Application of Plasma Polymerized Methylsilane Resist For All–Dry 193 nm Deep Ultraviolet Processing", J. Vac. Sci. Technol. B 13(6), Nov./Dec. 1995, p2994–2999.

*Primary Examiner*—George Fourson
*Assistant Examiner*—Elizabeth Abbott
*Attorney, Agent, or Firm*—Schmeiser, Olsen & Watts; Eugene I. Shkurko

[57] ABSTRACT

The preferred embodiments of the present invention overcome the limitations of the prior art by providing a method for forming the source/drain diffusions in a vertical transistor structure that results in improved channel length uniformity. In one embodiment, the present invention is used to form source/drain and bitline diffusion structures for use in pillar memory cells. Additionally, in another embodiment, the present invention is used to form source/drain and plate diffusion structures in pillar memory cells. Both preferred embodiments deposit conformal photoresist on a pillar structure and use an off-axis exposure process to recess a dopant source layer to the proper depth along the pillar. The recessed dopant source layer can then be used to form the source/drain/bitlines diffusions or source/drain/plate diffusions in the pillar memory device.

23 Claims, 9 Drawing Sheets

METHOD FOR FORMING PILLAR MEMORY CELLS AND DEVICE FORMED THEREBY

BACKGROUND OF THE INVENTION

1. Technical Field

The present invention relates generally to the field of semiconductor manufacturing and, more specifically, to a method for forming pillar memory cells.

2. Background Art

The need to remain cost and performance competitive in the production of semiconductor devices has caused continually increasing device density in integrated circuits. To facilitate the increase in device density, new technologies are constantly needed to allow the feature size of these semiconductor devices to be reduced.

The push for ever increasing device densities is particularly strong in Dynamic Random Access Memory (DRAM) markets. DRAM devices are used extensively in computer applications where large amounts of inexpensive yet relatively high performance memory is needed. As more advanced applications are developed, an increasing large amount of DRAM is needed. This has driven an ever increasing need for greater device densities and economical ways of producing these devices.

A typical DRAM chip is made of millions of individual DRAM "cells." Each cell contains a capacitor used to the memory charge, a switch used to access the capacitor, and some isolation regions around these devices. The individual cells are accessed using a large number of bit lines and word lines. By selecting an appropriate bit line and word line, a memory controller can access information contained in the desired DRAM cells.

The density of a DRAM chip is determined in a large part by the area needed for each DRAM cell. One particular area of concern in DRAM design is the storage capacitor used to store each memory cell. The density of DRAM designs is to a great extent limited to by the feature size of the storage capacitor. Capacitors by definition store charge between electrodes.

The charge stored in the storage capacitor is subject to current leakage and for that reason the DRAM must be refreshed periodically. The time allowed between refresh without excess charge leakage is the data retention time, which is determined by the amount of charge stored at the beginning of the storage cycle and the amount of leakage current through different kinds of leakage mechanisms. For various reasons it is often preferable to minimize the leakage mechanisms so as to extend the time allowed between refresh cycles.

Several methods have been used to facilitate the shrinkage of the cell feature size while maintaining sufficient capacitance. One of these methods is the use of pillar transistors with stacked capacitors located above the transistors, called a pillar DRAM cell. In one embodiment of a pillar DRAM cell the array channel device is bounded by an implant on the top of the pillar and by the buried plate at the base of the pillar. In another embodiment, the array channel device is bounded by an implant at the top of the pillar and a buried bitline. Today, these buried plates and bitlines are produced by filling the pillar structure with an organic material and recessing it back using an chemical etch process. The amount of recess controls the channel length of the transfer device which in turn determines the depth of the buried plate or bitline. Unfortunately, current methods of recessing the material typically result in significant nonuniformity as well as loading effects. This overall large tolerance results in channel length variation that can result in timing problems.

Additionally, because it is desirable to minimize shut off current in DRAM devices the transfer devices are typically designed with relatively long channels. This allows the transfer devices to be run far from the threshold voltage. Unfortunately, the lack of channel length uniformity resulting from current processes requires that devices be run at less than their optimal speed.

Thus, the prior art methods for forming plates and bitlines in pillar DRAM devices suffers from excessive nonuniformity, resulting in unwanted variations in channel length that can seriously degrade the performance of the devices.

DISCLOSURE OF INVENTION

Accordingly, the present invention provides a method for forming the source/drain diffusions at the base of the pillar in a vertical transistor structure that results in improved channel length uniformity. In one embodiment, the present invention is used to form source/drain and bitline diffusion structures for use in pillar memory cells. Additionally, in another embodiment, the present invention is used to form source/drain and plate diffusion structures in pillar memory cells. Both preferred embodiments deposit conformal photoresist on a pillar structure and use an off-axis implant process to recess a dopant source layer to the proper depth along the pillar. The recessed dopant source layer can then be used to form the source/drain/bitlines diffusions or source/drain/plate diffusions in the pillar memory device.

The foregoing and other advantages and features of the invention will be apparent from the following more particular description of a preferred embodiment of the invention, as illustrated in the accompanying drawings.

BRIEF DESCRIPTION OF DRAWINGS

The preferred exemplary embodiment of the present invention will hereinafter be described in conjunction with the appended drawings, where like designations denote like elements.

BEST MODE FOR CARRYING OUT THE INVENTION

The preferred embodiment of the present invention overcomes the limitations of the prior art and provides a method for forming the source/drain diffusions in a pillar memory cell that result in increased channel length uniformity. The preferred method uses a conformal photoresist and a shadowing process to recess a dopant source layer to the proper depth along the pillar. The recessed dopant source layer can then be used to form the source/drain diffusions in the transfer device.

In a first preferred embodiment, the pillar memory cell uses a buried plate to connect the common source/drains in all the memory cells. The buried plate in this embodiment is formed with the source/drain diffusions. In this embodiment, bitlines form a separate wiring level above to connect one side of the storage capacitor with the other side connected to the top of the pillar.

In a second preferred embodiment, the pillar memory cell uses a buried bitline to connect one row of memory cells together. The buried bitline in this embodiment is common with the source/drain diffusions. In this embodiment, the plate is used to connect one side of all the storage capacitors together, with the other side of the storage capacitors connected to their corresponding source/drain at the top of the pillar.

Those skilled in the art will recognize that bitlines and plates are both conductive paths that connect the various memory cells together, with bitlines connecting one row of memory cells together such that the bitlines can be used to selectively access memory cells, and plates connecting all the capacitors together to a common reference voltage. Thus, in this application the term "buried conductor" is meant to include both the buried plate as in the first embodiment and a buried bitline as in the second embodiment, as well as other buried conductors. Likewise, the term "source/drain" is meant to be a general term referring to either source and drain diffusions.

It should be noted that while the preferred embodiments are described with reference to forming source/drain diffusions, bitlines and plates in Dynamic Random Access Memory (DRAM) devices, they are also applicable to the formation of other types of memory devices such as the DRAM variations (Extended Data Out DRAM, Burst Extended Data Output DRAM, Synchronous DRAM, etc) and Static Random Access Memory (SRAM) and its variations (Asynchronous SRAM, Synchronous SRAM, Pipelined Burst SRAM, etc.). The preferred embodiment methods can also be used to form the source/drain diffusions for transistors in non-memory cell applications such as for logic circuits.

Figure 1:
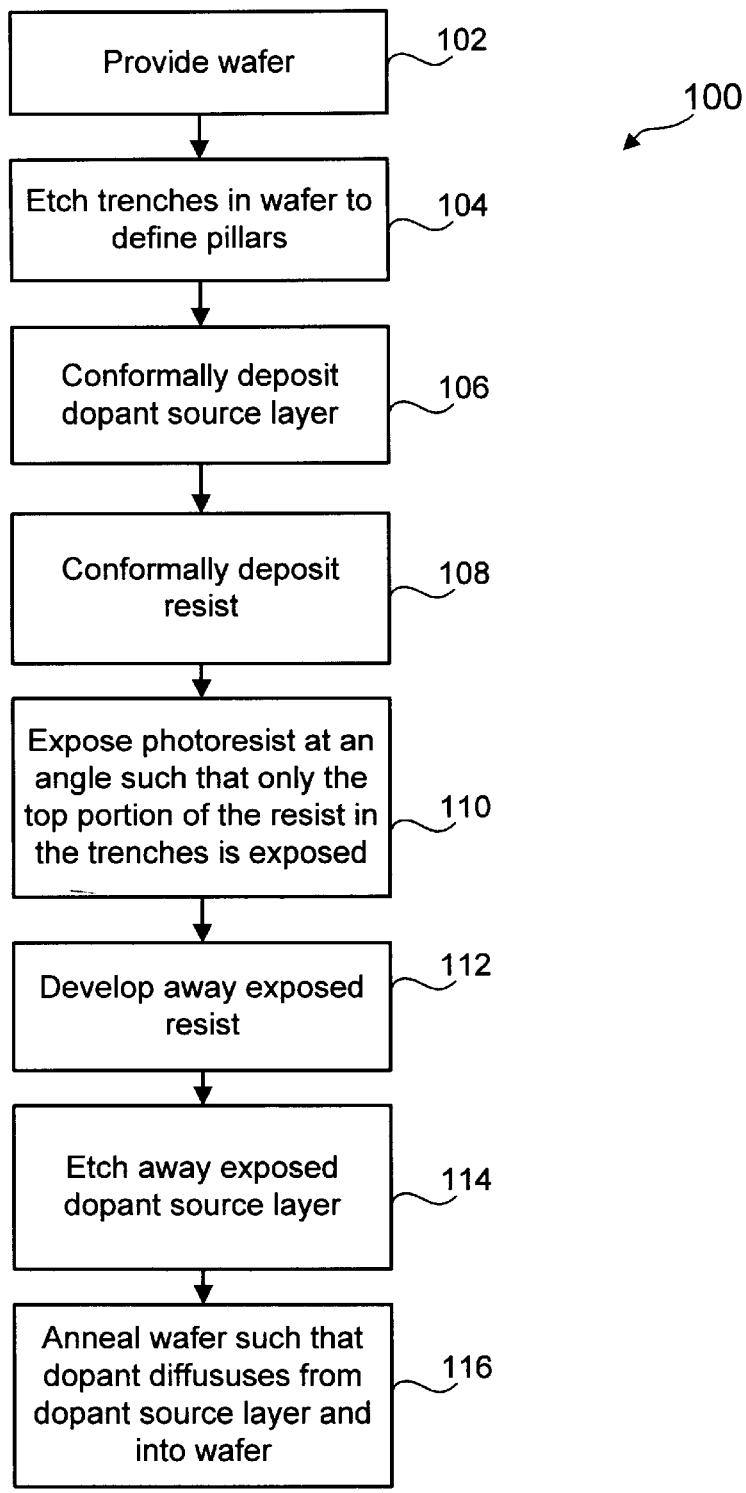
FIG. 1 is a flow diagram illustrating a preferred method for forming source/drain/buried conductor diffusions.

Turning now to FIG. 1, a method 100 for forming source/drain diffusions in accordance with the preferred embodiments is illustrated. The method 100 will be illustrated in FIGS. 2–7 with reference to the first embodiment where the method that forms the source/drain diffusions also defines the buried plates that connect memory cells together.

The first step 102 is to provide a suitable semiconductor wafer. Preferably, the wafer will comprise a suitable doped silicon substrate, but could also comprise other semiconductor materials, galium arsenic. Additionally, substrates such as silicon-on-insulator wafers could also be used.

The next step 104 is to etch trenches in the wafer to define the pillars. This can be done using any suitable etch process. For example, one method is to form a thin oxide on the wafer, followed by pad nitride. Photoresist is then deposited on the nitride and patterned. The patterned photoresist is then used to etch the nitride and oxide. The resist is then stripped. The trenches are then etched using a suitable etchant and the remaining nitride and oxide as an etch mask. Of course, this is just one way in which the trenches and pillars could be defined. As will be explained in greater detail later, the width of the trenches is a factor used to determine the channel length of the transfer devices as well as the size of the source/drain diffusions.

Figure 2:
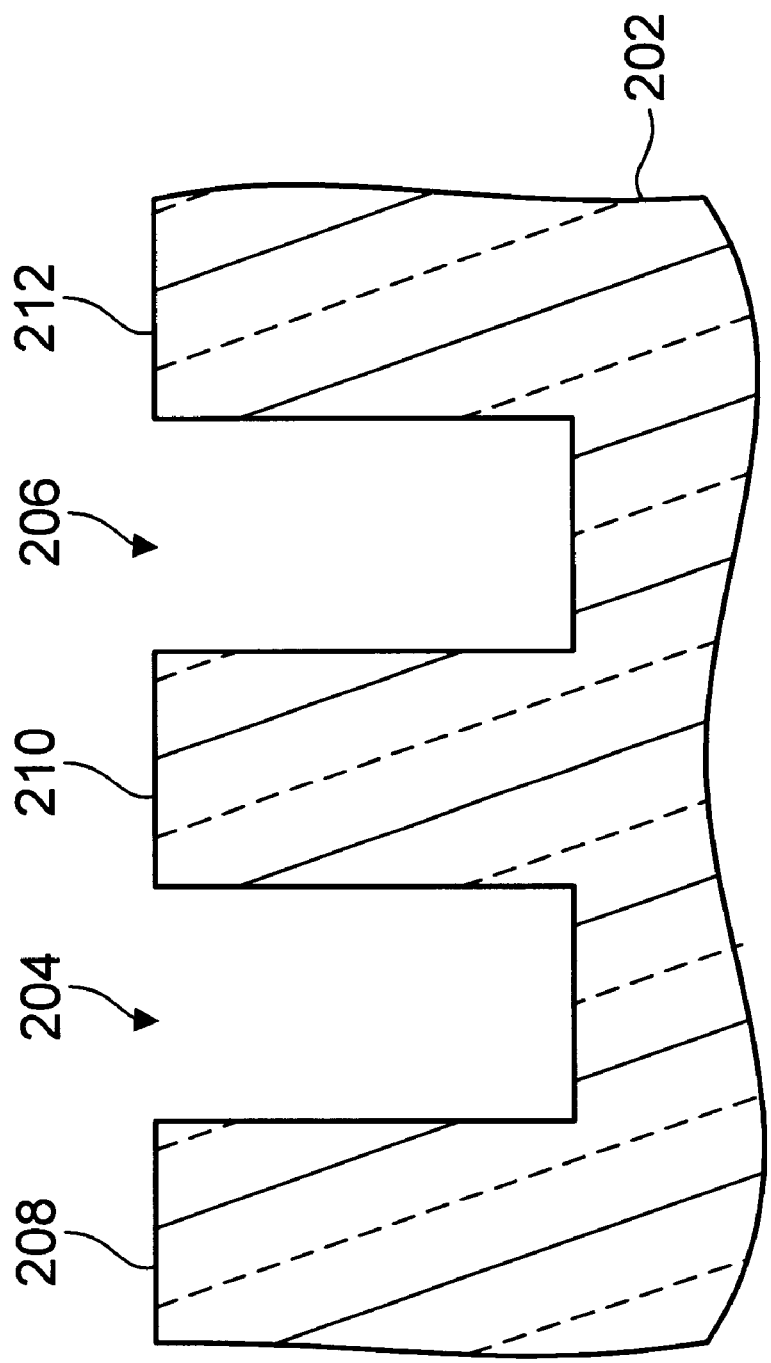
FIGS. 2–9 are cross sectional side views of wafer portions during processing in accordance with the preferred embodiment of the present invention.

Turning now to FIG. 2, a cross section of a wafer portion 202 is illustrated in which two exemplary trenches 204 and 206 have been etched, forming pillars 208, 210 and 212.

Returning to FIG. 1, the next step 106 is to conformally deposit a dopant source layer. The dopant source layer is preferably conformally deposited to cover sidewalls of the pillars and the bottoms of the trench. The dopant source layer will be used to provide dopants to form the buried bitlines in the memory devices. As such, the dopant source layer can comprise any suitable material containing the desired dopants. For example, arsenic doped glass (ASG), boron phosphorous doped glass (BPSG), and doped polysilicon could all be used as dopant source layers.

The next step 108 is to conformally deposit a photoresist which will be used to pattern the underlying dopant source layer. Preferably, the resist is a positive tone resist, meaning that exposed portions of the resist become soluble in the developer solution used. The preferred method of conformally depositing the resist is to use chemical vapor deposition (CVD) and a suitable resist. By conformally depositing the resist, it adheres to the sidewalls of the trench, as well as to the horizontal surfaces. Thus, the resist covers the dopant source layer previously deposited.

One example of a suitable resist is a polysilane resist that is deposited from a plasma formed with methylsilane. This resist has several unique properties. First, it can be developed as both positive and negative tone resist. Second, the resist can be conformally deposited using methylsilane in a chemical vapor deposition (CVD) process. Third, it can be activated both by two types of exposures, an oxygen ion implantation or by irradiation with UV light in the presence of oxygen. During either type of exposure, the silicon-silicon bonds are cleaved, and oxygen reacts with the activated silicon atoms. Silicon dioxide is formed in the exposed areas as a result of this reaction, while the unexposed areas remain as polysilane. The develop process utilizes chemistry, either in solution, vapor, or plasma form, that selectively removes either silicon (to make a negative tone image) or silicon dioxide (to make a positive tone image). In order to enhance the formation of silicon-silicon bonds during the deposition, low plasma powers and low temperatures are used. Silicon-carbon bonds are generally not cleaved upon exposure, and degrade the resist response. A process for the deposition and development of these resist films has been commercialized by Applied Materials, Inc., of Santa Clara, Calif. A general description of the process is available in the literature, e.g., R. L. Kostelak, T. W. Weidman, S. Vaidya, O. Joubert, S. C. Palmateer, M. Hibbs, J. Vac. Sci. Tech. R, vol 13,1995, p2994–2999, T. W. Weidman, A. M. Joshi Appl. Phys. Lett. vol 62,1993, p372–374.

In the preferred embodiment of the present invention the polysilane resist is used in its positive tone manner. In particular, the resist is implanted with oxygen ions, and then developed with a hydrofluoric acid based developer that removes only those portions of resist that are implanted with oxygen.

Figure 3:
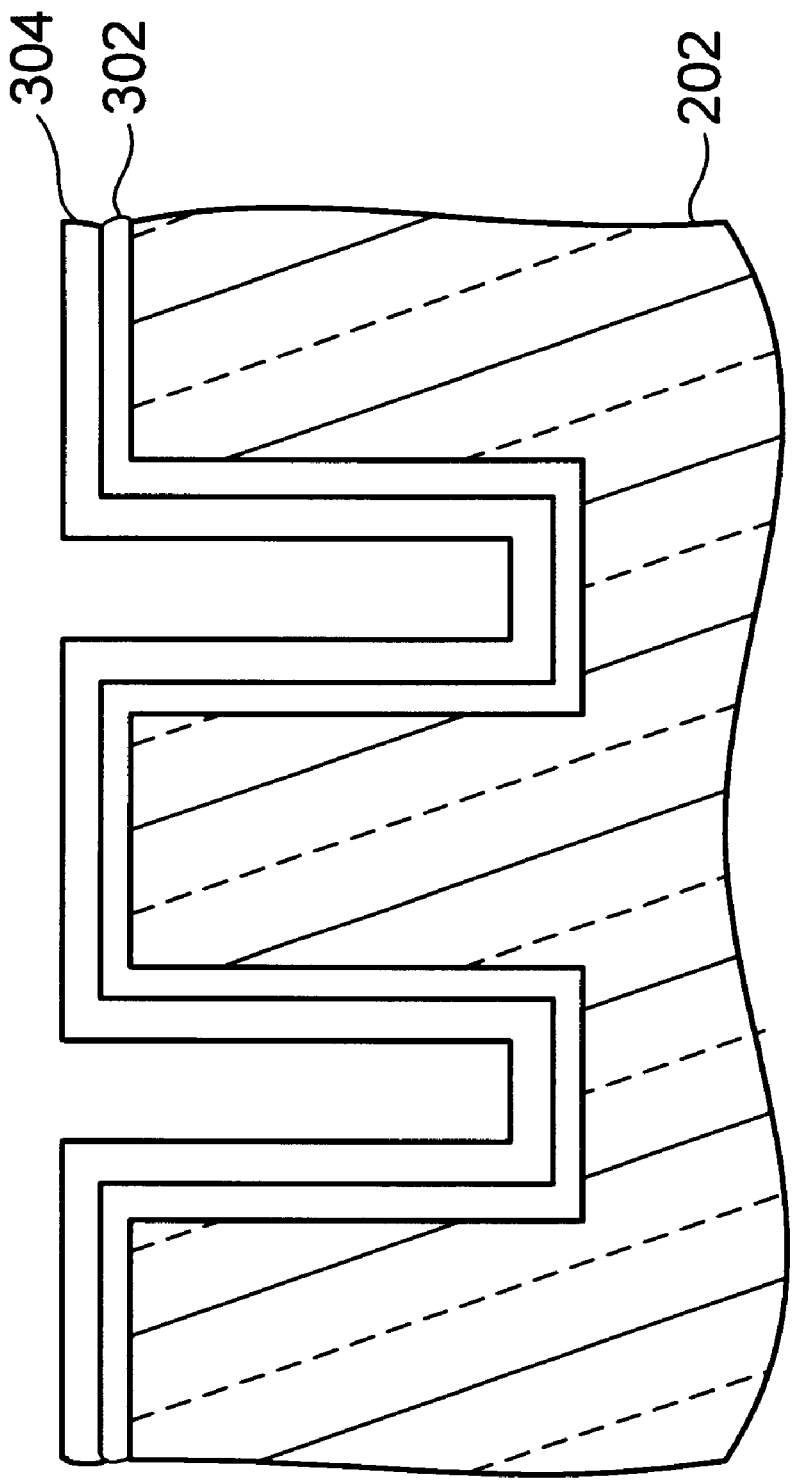

Turning now to FIG. 3, the exemplary wafer portion 202 is illustrated after a dopant source layer 302 and a conformal resist layer 304 have been deposited to cover the wafer portion. In accordance with the preferred embodiments, both the dopant source layer 302 and the conformal resist layer 304 cover both the horizontal and vertical surfaces in the wafer portion.

The next step 110 of method 100 is to expose the wafer at a non-perpendicular angle to the top surface of the wafer such that the upper portion of the conformal resist layer in the trenches are exposed, while the lower portion of the conformal resist layer is unexposed. This exposure causes the resist to become soluble in developer solution. This exposure can be done in several ways depending upon the resist formulation used. For example, when using the preferred silane resist, the exposure preferably comprises oxygen ion implantation at the desired angle. For the preferred resist, this exposure will cause the upper portions of the resist in the trenches to become soluble in certain developer solutions, while the lower portions remain insoluble to those developer solutions. The oxygen implant is preferably performed using an ion implant tool that creates charged ions of oxygen, uses an electric field to accelerate the charged ions toward the surface of wafer. This causes the oxygen to be implanted into resist, and the resist to be made soluble to an hydrofluoric acid developer. Typically, this step will require at least two exposures, one from each side of the wafer such that resist on all sides of the pillar are implanted with oxygen.

Additionally, for silane and other resists the exposure may comprise illumination at the desired angle with light of an appropriate wavelength, although this is generally not preferable because of unwanted diffraction effects.

Figure 4:
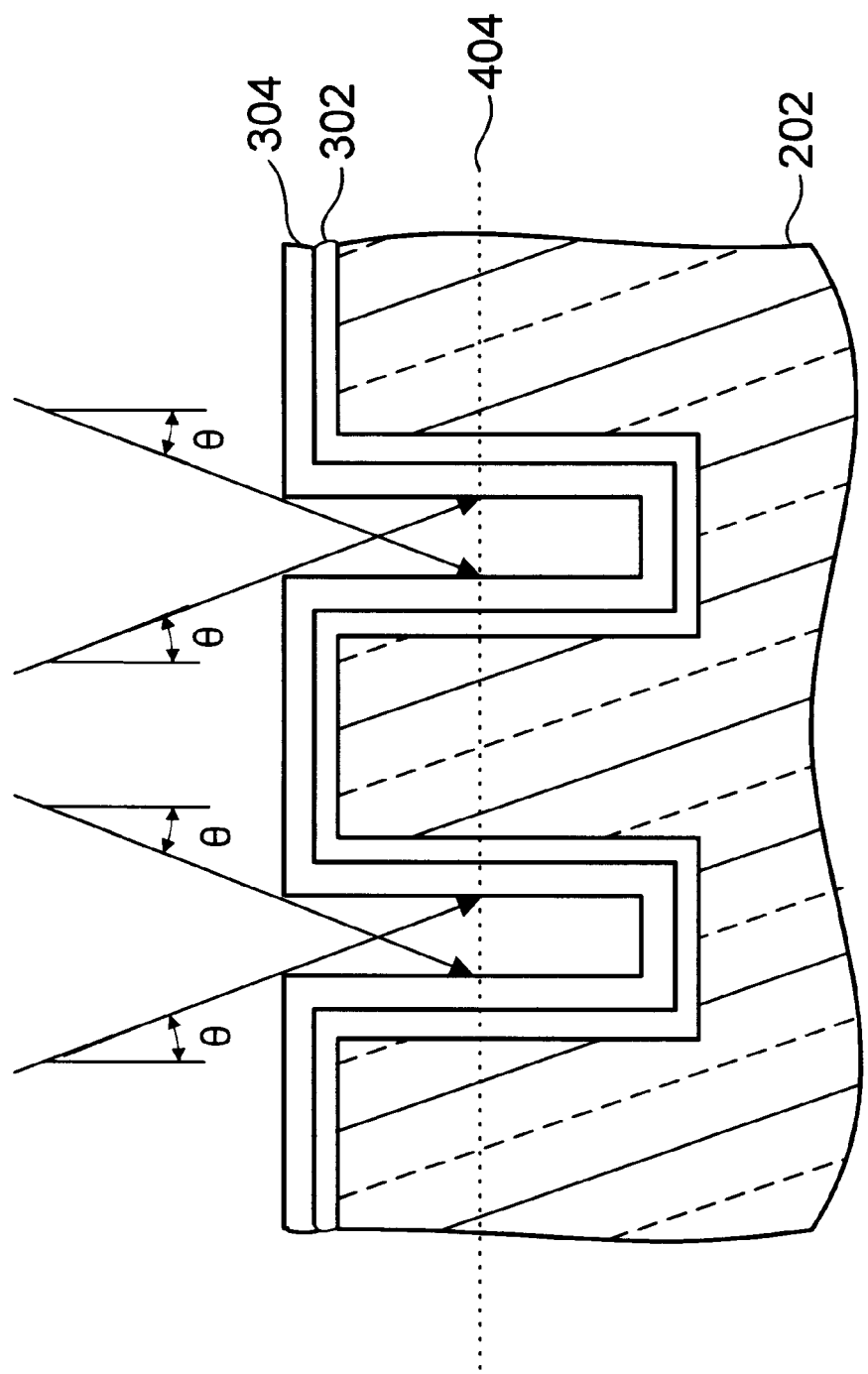

Turning now to FIG. 4, the exemplary wafer portion 202 is illustrated showing the effects of an angled exposure. In particular, the by exposing the wafer at two nonperpendicular angles, the upper portions (above line 404) of the resist on the sidewalls of the pillars 208, 210 and 212 are exposed, while the lower portions (below line 404) of the resist are shadowed by the sidewall and remain unexposed.

It should be noted that the depth of the exposure down the pillar is dependent upon only two factors, the angle of exposure, and the width of the trench opening. In particular, the depth of the exposure D is:

$$D = W/\tan\theta$$

where W is the width of the trench opening coated with resist and θ is the off-axis angle of exposure. With the depth of exposure fully dependent upon these two factors, the depth can be tightly controlled. As will be shown, this will result in significantly less channel length nonuniformity than other methods for forming pillar DRAMs. Additionally, by selecting an appropriate angle, manufacturing variations in trench width W can be corrected to form consistent recess.

Figure 5:
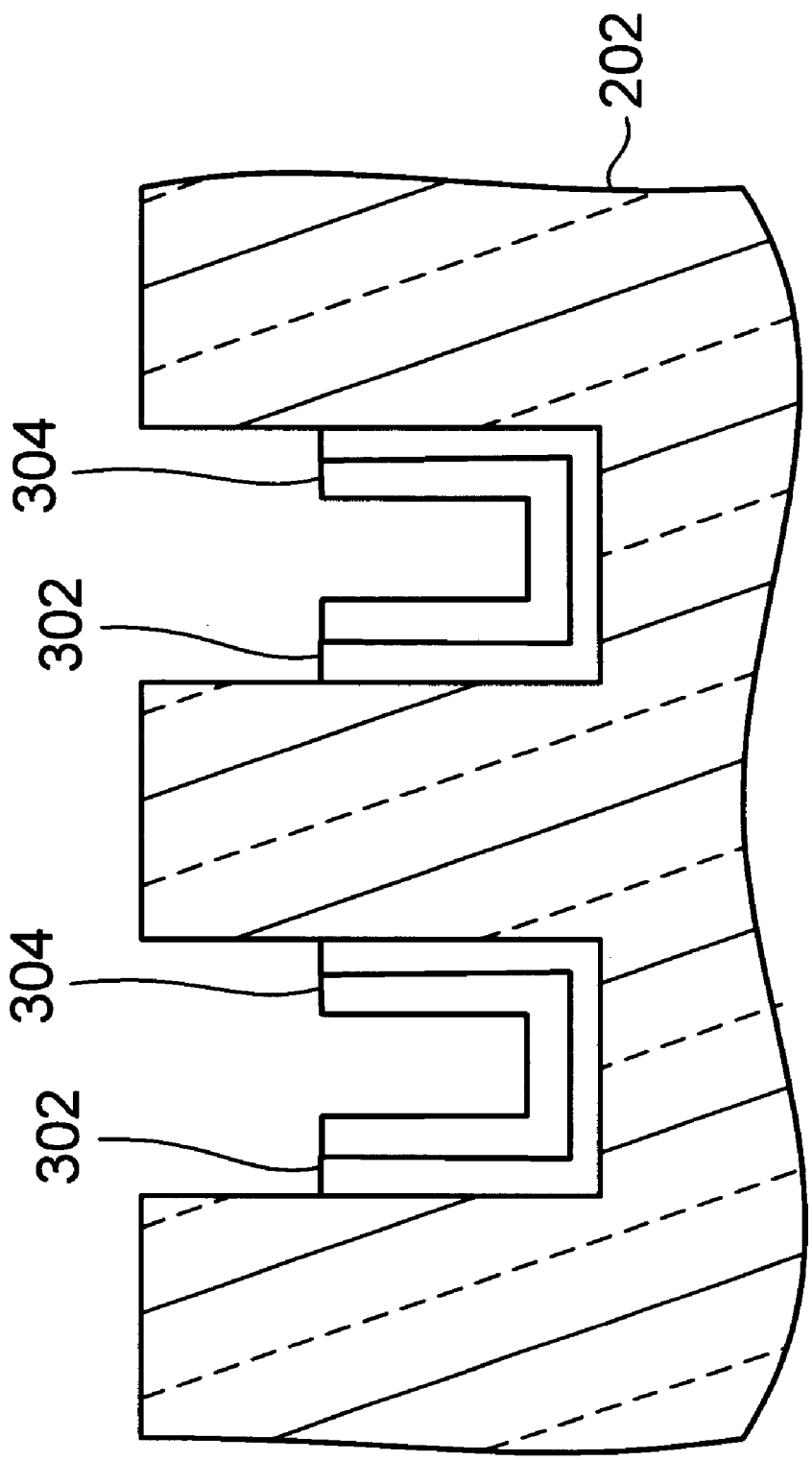

Returning to FIG. 1, the next step 112 is to develop away the exposed resist. This can be done using any suitable etch process that is compatible with the resist used. The next step 114 is to remove the dopant source material exposed by the resist development. This can be done using any compatible process. In the preferred embodiment using silane resist and an ASG dopant source layer, steps 112 and 114 can be accomplished using a single hydrofluoric acid (HF) bath. The HF bath will develop away the exposed resist, while leaving the unexposed portions. The HF bath will also remove those portions of the dopant source layer that were under the removed resist. Turning now to FIG. 5, the exemplary wafer portion 202 is illustrated after the exposed portions of resist 304 have been removed, while the unexposed portions of resist layer 304 remain. Likewise, the portions of dopant source layer 302 under the removed resist portions are also removed, while the dopant source layer 302 remains under the remaining resist layer 304. It should be noted that this process for removing the dopant source layer may result in some undercutting of the dopant source layer at the top edges of the remaining resist. This undercutting is acceptable as long as its effect on channel length are taken into account when determining the exposure angle to use.

Returning to FIG. 1, the next step 116 in the preferred method is to anneal the wafer such that dopant diffuses from the dopant source layer and into the adjacent sources of the wafer. The diffusion of the dopant into the wafer forms the source/drains for the transfer transistors, and the bit lines in accordance with the present invention. The parameters of this annealing would depend upon the desired dopant profile of the bitlines and the amount of dopant in the dopant source layer. With dopant diffused into the wafer, the remaining resist and dopant source layer can be stripped away using any suitable process. For example, a blanket exposure followed by an HF bath can be used to strip the remaining resist and dopant source layer.

Figure 6:
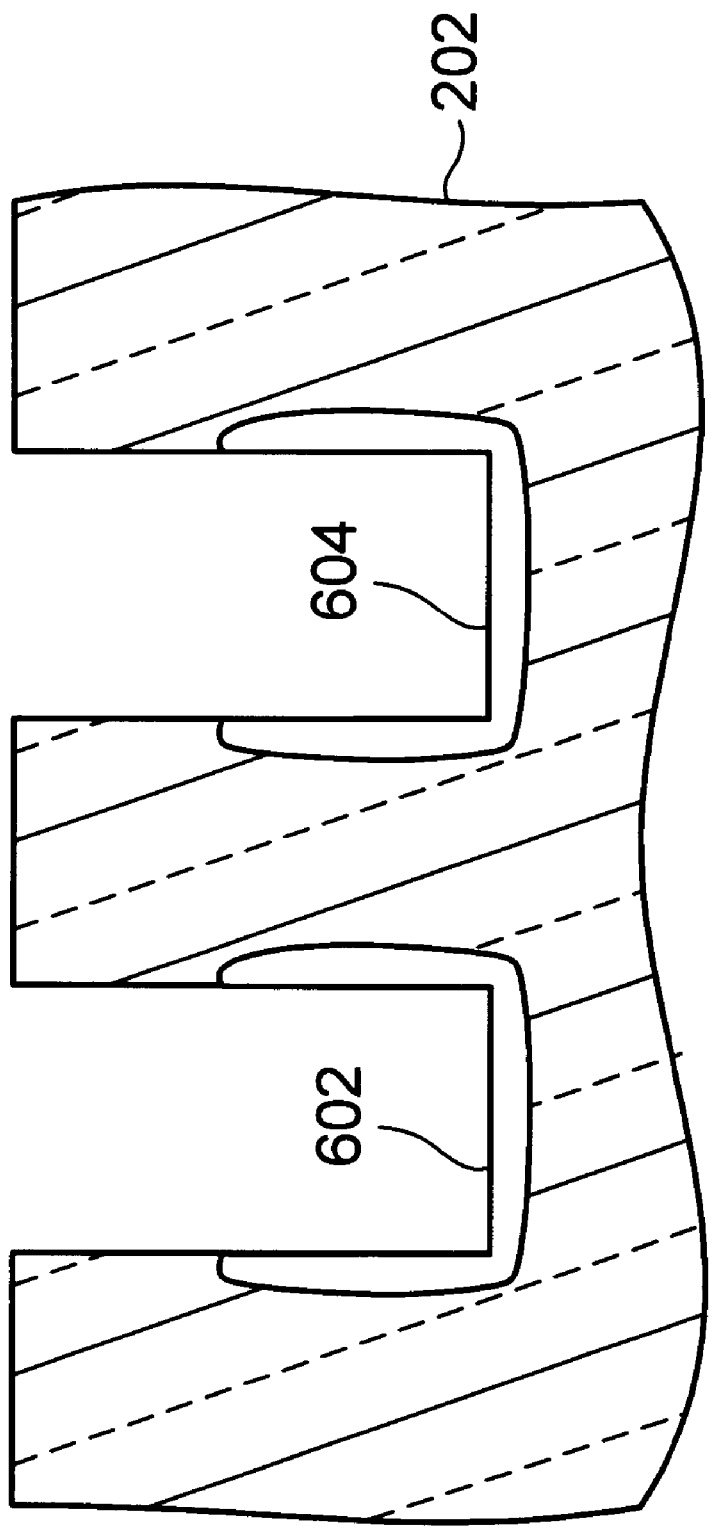

Turning now to FIG. 6, the wafer portion 202 is illustrated after dopant has been annealed from the dopant source layer and into the wafer to form diffusions 602 and 604 into the wafer, and the remaining dopant source layer and resist has been removed. These diffusions serve as the source/drain diffusions of the transfer devices as well as the buried plate that connects memory cells. In particular, diffusion 602 will serve as the source/drain diffusion for two adjacent transfer devices, as well as the plate that connects those diffusions to the same diffusions on other memory cells. Likewise, diffusion 604 will serve as the source/drain diffusion and plate for two other adjacent transfer devices.

Figure 7:
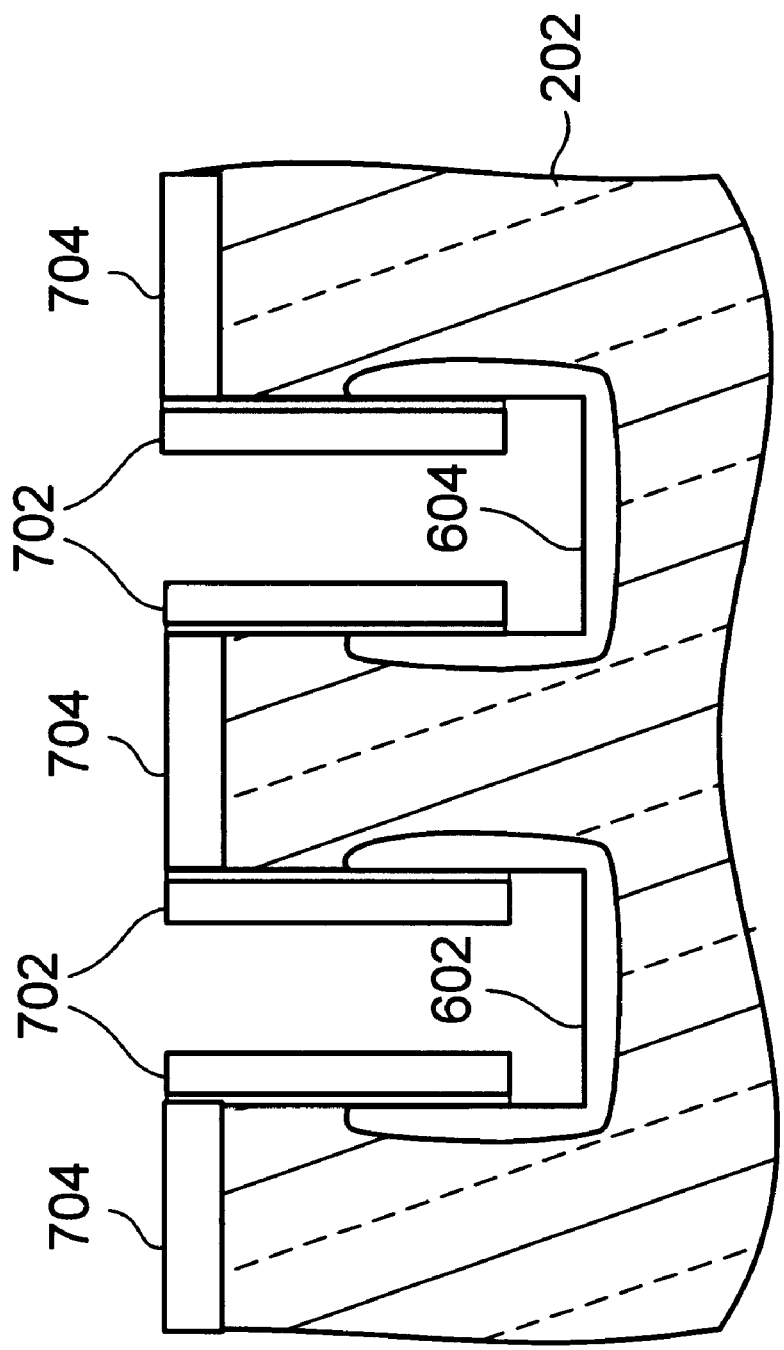

With the source/drain/plate diffusions formed, the remaining portions of the devices can be completed using standard pillar DRAM processing. This would include the formation to gates/wordlines and the connection of the various buried plates together. Turning to FIG. 7, cross sectional side views of completed devices are shown on wafer portion 202. Included in the completed devices are gate electrodes 702, which also serve as wordlines for the memory devices, and diffusions 704 formed at the top of the pillars that serve as the complementary source/drain diffusions for the transfer devices. As can be seen from this figure, the channel length for the transfer devices is the distance between source/drain/plate diffusions 602 and 604 and the corresponding source/drain diffusions 704. Thus, the preferred method of forming source/drain/plate diffusions that results in more tightly controlled placement of these diffusions results in more tightly controlled channel length for the transistors. This results in significant performance improvement over prior art devices.

Figure 8:
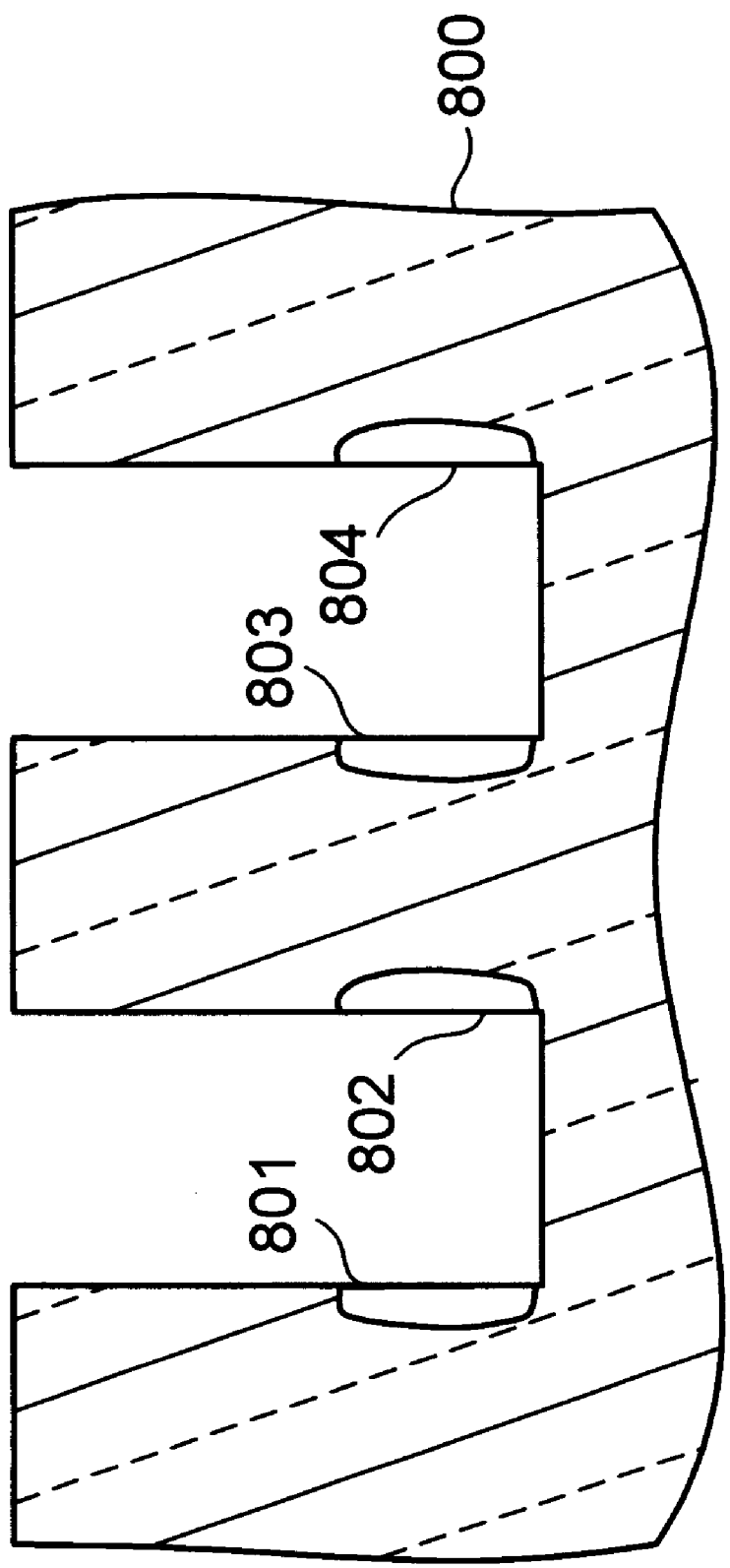
Figure 9:
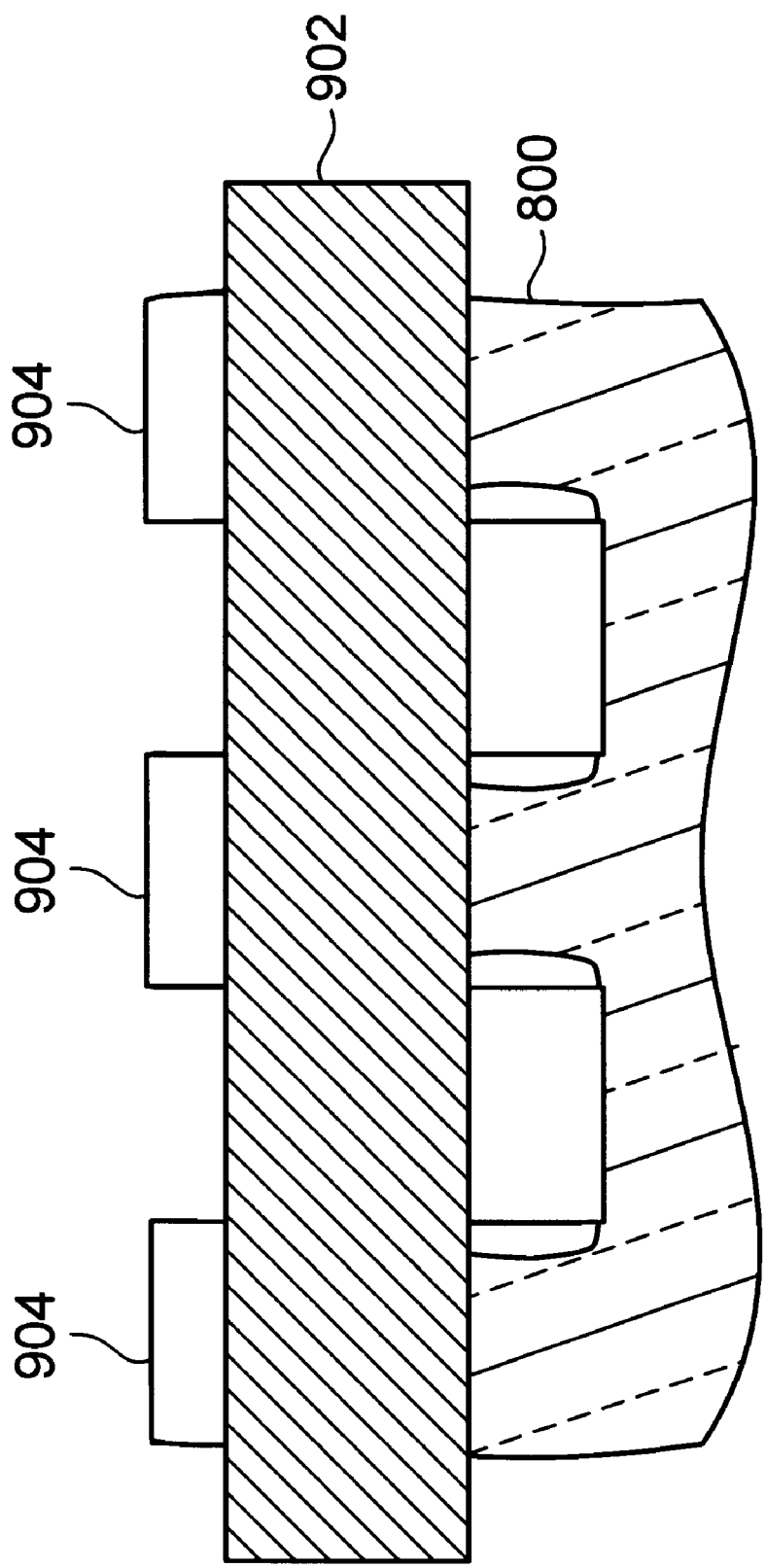

While FIG. 7 illustrates a pillar DRAM formed in accordance with the first embodiment, where the process that defines the source/drains also defines buried plates, the second embodiment uses a similar process to define buried bitlines. Turning now to FIGS. 8 and 9, the second embodiment where the preferred method forms buried bitlines is illustrated. The initial steps of the second embodiment are substantially similar to the first. In particular, trenches are formed in the substrate, a dopant source layer is conformally deposited followed by a conformal deposition of resist. The resist is then exposed at a non-perpendicular angle such that the top portions of the trench are exposed while the bottom portions are unexposed. The exposed resist and the dopant source layer under the resist are then removed. The wafer is then annealed, causing dopant to diffuse from the remaining dopant source layer and into the substrate. The remaining resist and dopant source layer can then be removed. This leaves the wafer similar to that illustrated in FIG. 6 with reference to the first embodiment.

In the second embodiment however, the diffusion that was used to form the source/drain/plate will instead be used to form source/drain bitlines. This requires that the diffusion be divided into two separate portions such that two separate bitlines can be formed. This can be accomplished by etching the bottom of the trench further down using a directional etch. Turning now to FIG. 8, a wafer portion 800 is illustrated after the bottom of the trenches have been further etched, separating the diffusions into diffusions 801, 802, 803 and 804. These diffusions serve as the source/drain diffusions for the transfer devices as well as the bitlines that connect the various transfer devices.

With the source/drain/bitline diffusions formed, the remaining portions of the devices can completed using standard pillar DRAM processing. This would include the formation to gates/wordlines. In this embodiment, the gates/wordlines would be formed running substantially perpendicular to the trenches that are already formed. This typically requires the etching of additional trenches running that direction, and forming the gates/wordlines on the sides of those trenches. Turning to FIG. 9, the wafer portion 800 is shown with a gate/wordline 902 formed across the wafer portion. Similar wordlines would be formed in other trenches at other cross sections. Included in the completed devices diffusions 904 formed at the top of the pillars that serve as the complementary source/drain diffusions for the transfer devices. As can be seen from this figure, the channel length for the transfer devices once again the distance between source/drain/bitline diffusions 801, 802, 803, and 804 and the corresponding source/drain diffusions 904. Thus, the preferred method of forming source/drain/plate diffusions that results in more tightly controlled placement of these diffusions results in more tightly controlled channel length for the transistors. This results in significant performance improvement over prior art devices. Not shown in this figure are the capacitors formed, and the wiring which severs as the plate to connect the devices together.

In one notable variation on the preferred embodiment, a separate dopant source layer is not used. Instead, the silane resist is doped with a suitable dopant, and thus itself serves as the dopant source layer. This variation is desirable because of its relative simplicity, although it does have limitations in the amount of dopant that can be diffused from the resist and into the substrate.

Thus, the preferred embodiment of the present invention provides a method for forming source/drain diffusions in pillar transistors that result in more uniform channel lengths. The present invention also provides a buried conductor that can be used as a buried plate in one memory structure, and a buried bitline in another memory structure.

While the invention has been particularly shown and described with reference to an exemplary embodiment to form source/drain/buried conductor diffusions in pillar DRAM cells, those skilled in the art will recognized that the process can be used to form source/drain in other devices. For example, it will also be understood by those skilled in the art that the invention is applicable to different isolation technologies (e.g., LOCOS, recessed oxide (ROX), STI, etc.), well and substrate technologies, dopant types, energies and species. It will also be understood that the spirit of the invention is applicable to other silicon-based technologies (e.g., BiCMOS, bipolar, silicon on insulator (SOI), silicon germanium (SiGe).

What is claimed is:

1. A method for forming a feature on a semiconductor substrate, the method comprising the steps of:
    a) forming a trench having sidewalls and a bottom in the substrate;
    b) forming a dopant source layer on the substrate, said dopant source layer covering the trench sidewalls and trench bottom;
    c) forming a resist layer on the dopant source layer, said resist layer covering said dopant source layer on the trench sidewalls and trench bottom;
    d) exposing the resist layer at an angle such that upper portions of the resist layer on the trench sidewalls are exposed and lower portions of the resist layer on the trench sidewalls are unexposed;
    e) removing the exposed portion of the resist layer and the dopant source layer beneath the exposed portion of the resist layer; and
    f) diffusing dopant from the unexposed portion of the dopant source layer into the substrate.

2. The method of claim 1 wherein the step of exposing the resist layer comprises implanting ions into the resist layer.

3. The method of claim 1 wherein the step of exposing the resist layer comprises implanting oxygen into the resist layer.

4. The method of claim 1 wherein the step of exposing the resist layer comprises exposing with an optical lithography tool.

5. The method of claim 1 wherein the step of forming a resist layer comprises chemical vapor deposition of a resist layer on the substrate.

6. The method of claim 1 wherein the resist layer comprises polysilane.

7. The method of claim 1 wherein the step of forming a resist layer comprises chemical vapor deposition of polysilane resist from a plasma formed with methylsilane.

8. The method of claim 1 wherein the feature formed comprises a buried conductor at the bottom of the trench.

9. The method of claim 1 wherein the feature formed comprises a source/drain diffusion in a transistor.

10. The method of claim 1 wherein the feature formed comprises a source/drain/plate diffusion in a memory cell.

11. The method of claim 1 wherein the feature formed comprises a source/drain/bitline diffusion in a memory cell.

12. The method of claim 1 wherein the dopant source layer comprises an arsenic doped layer.

13. The method of claim 1 wherein the resist layer comprises a doped polysilane resist layer.

14. The method of claim 1 wherein the exposed resist is removed using a hydroflouric acid bath.

15. A method for forming buried bitlines to connect memory cells on a semiconductor substrate, the method comprising the steps of:
    a) forming a trench having sidewalls and a bottom in the substrate;
    b) conformally depositing a dopant source layer on the substrate, said dopant source layer covering the trench sidewalls and trench bottom;
    c) conformally forming a resist layer on the dopant source layer, said resist layer covering said dopant source layer on the trench sidewalls and trench bottom;
    d) exposing the resist layer at an angle by implanting into the resist layer such that upper portions of the resist layer on the trench sidewalls are exposed and lower portions of the resist layer on the trench sidewalls are blocked by the trench sidewalls and unexposed;
    e) removing the exposed portion of the resist layer and the dopant source layer beneath the exposed portion of the resist layer;
    f) diffusing dopant from the unexposed portion of the dopant source layer into the substrate to form a diffusion region; and
    g) further etching the bottom of the trench such that the diffusion region is divided into two source/drain/bitline diffusion regions.

16. The method of claim 15 wherein the step of conformally forming a resist layer comprises chemical vapor deposition of a resist layer on the substrate.

17. The method of claim 15 wherein the step of conformally forming a resist layer comprises chemical vapor deposition of polysilane resist from a plasma formed with methylsilane.

18. The method of claim 15 wherein the resist layer comprises a doped polysilane resist layer.

19. The method of claim 15 wherein the step exposing the resist layer comprises implanting oxygen into the resist layer.

20. A method for forming a buried plates in a memory cell on a semiconductor substrate, the method comprising the steps of:
   a) forming a trench having sidewalls and a bottom in the substrate;
   b) conformally depositing a dopant source layer on the substrate, said dopant source layer covering the trench sidewalls and trench bottom;
   c) conformally forming a resist layer on the dopant source layer, said resist layer covering said dopant source layer on the trench sidewalls and trench bottom;
   d) exposing the resist layer at an angle by implanting into the resist layer such that upper portions of the resist layer on the trench sidewalls are exposed and lower portions of the resist layer on the trench sidewalls are blocked by the trench sidewalls and unexposed;
   e) removing the exposed portion of the resist layer and the dopant source layer beneath the exposed portion of the resist layer; and
   f) diffusing dopant from the unexposed portion of the dopant source layer into the substrate to form a buried plate diffusion region.

21. The method of claim 20 wherein the step of conformally forming a resist layer comprises chemical vapor deposition of polysilane resist from a plasma formed with methylsilane.

22. The method of claim 20 wherein the resist layer comprises a doped polysilane resist layer.

23. The method of claim 20 wherein the step of exposing the resist layer comprises implanting oxygen into the resist layer.

* * * * *